US009249502B2

(12) United States Patent
Albano et al.

(10) Patent No.: US 9,249,502 B2
(45) Date of Patent: Feb. 2, 2016

(54) METHOD FOR HIGH VOLUME MANUFACTURE OF ELECTROCHEMICAL CELLS USING PHYSICAL VAPOR DEPOSITION

(75) Inventors: Fabio Albano, Canton, MI (US); Chia-Wei Wang, Ann Arbor, MI (US); Ann Marie Sastry, Ann Arbor, MI (US)

(73) Assignee: SAKTI3, INC., Ann Arbor, MI (US)

( * ) Notice: Subject to any disclaimer, the term of this patent is extended or adjusted under 35 U.S.C. 154(b) by 0 days.

(21) Appl. No.: 12/484,966

(22) Filed: Jun. 15, 2009

(65) Prior Publication Data

US 2009/0325063 A1   Dec. 31, 2009

Related U.S. Application Data

(60) Provisional application No. 61/074,448, filed on Jun. 20, 2008.

(51) Int. Cl.
*H01M 10/02* (2006.01)
*C23C 14/34* (2006.01)
(Continued)

(52) U.S. Cl.
CPC ............. *C23C 14/562* (2013.01); *C23C 16/545* (2013.01); *H01M 4/0421* (2013.01); *H01M 4/139* (2013.01); *H01M 10/052* (2013.01);
(Continued)

(58) Field of Classification Search
CPC .. C23C 14/562; C23C 16/545; H01M 4/0421
USPC .................... 118/718; 156/345.2; 204/298.24
See application file for complete search history.

(56) References Cited

U.S. PATENT DOCUMENTS 2,862,646 A   12/1958   Hayford et al.
4,009,052 A    2/1977   Whittingham
(Continued)

FOREIGN PATENT DOCUMENTS

EP   1593754 A1    9/2005
JP   05-320906 A  12/1993
(Continued)

OTHER PUBLICATIONS

International Search Report and Written Opinion of PCT Application No. PCT/US09/47846, dated Aug. 7, 2009, 12 pages total.
(Continued)

*Primary Examiner* — Parviz Hassanzadeh
*Assistant Examiner* — Nathan K Ford
(74) *Attorney, Agent, or Firm* — Richard T. Ogawa; Ogawa P.C.

(57) ABSTRACT

Embodiments of the present invention relate to apparatuses and methods for fabricating electrochemical cells. One embodiment of the present invention comprises a single chamber configurable to deposit different materials on a substrate spooled between two reels. In one embodiment, the substrate is moved in the same direction around the reels, with conditions within the chamber periodically changed to result in the continuous build-up of deposited material over time. Another embodiment employs alternating a direction of movement of the substrate around the reels, with conditions in the chamber differing with each change in direction to result in the sequential build-up of deposited material over time. The chamber is equipped with different sources of energy and materials to allow the deposition of the different layers of the electrochemical cell.

17 Claims, 7 Drawing Sheets

(51) Int. Cl.

| | |
|---|---|
| C23C 14/56 | (2006.01) |
| C23C 16/54 | (2006.01) |
| H01M 4/04 | (2006.01) |
| H01M 4/139 | (2010.01) |
| H01M 10/052 | (2010.01) |
| H01M 10/0587 | (2010.01) |
| H01M 10/0562 | (2010.01) |
| H01M 10/0565 | (2010.01) |

(52) U.S. Cl.
CPC ...... *H01M 10/0587* (2013.01); *H01M 10/0562* (2013.01); *H01M 10/0565* (2013.01); *Y02E 60/122* (2013.01); *Y02P 70/54* (2015.11)

(56) References Cited

U.S. PATENT DOCUMENTS

| | | | |
|---|---|---|---|
| 4,648,347 | A | 3/1987 | Aichert et al. |
| 4,854,264 | A | 8/1989 | Noma et al. |
| 4,933,889 | A | 6/1990 | Meshkat et al. |
| 5,107,791 | A | 4/1992 | Hirokawa et al. |
| 5,338,625 | A | 8/1994 | Bates et al. |
| 5,367,465 | A | 11/1994 | Tazawa et al. |
| 5,377,118 | A | 12/1994 | Leon et al. |
| 5,402,366 | A | 3/1995 | Kihara et al. |
| 5,411,592 | A * | 5/1995 | Ovshinsky et al. ........... 118/718 |
| 5,453,934 | A | 9/1995 | Taghavi et al. |
| 5,498,489 | A | 3/1996 | Dasgupta et al. |
| 5,571,749 | A * | 11/1996 | Matsuda et al. ............ 438/484 |
| 5,751,591 | A | 5/1998 | Asada |
| 5,906,757 | A | 5/1999 | Kong et al. |
| 6,016,047 | A | 1/2000 | Notten et al. |
| 6,294,479 | B1 * | 9/2001 | Ebe et al. ................. 438/758 |
| 6,350,222 | B2 | 2/2002 | Susnjara |
| 6,402,443 | B1 | 6/2002 | Hoppe |
| 6,656,234 | B2 | 12/2003 | Dexter et al. |
| 6,833,031 | B2 | 12/2004 | Arnold |
| 6,884,333 | B2 | 4/2005 | Landau |
| 6,924,164 | B2 | 8/2005 | Jenson |
| 6,962,823 | B2 | 11/2005 | Empedocles et al. |
| 6,982,132 | B1 | 1/2006 | Goldner et al. |
| 7,107,193 | B1 | 9/2006 | Hummel et al. |
| 7,194,801 | B2 | 3/2007 | Jenson et al. |
| 7,294,209 | B2 | 11/2007 | Shakespeare |
| 7,315,789 | B2 | 1/2008 | Plett |
| 7,361,327 | B2 | 4/2008 | Tumas et al. |
| 7,490,710 | B1 | 2/2009 | Weskamp et al. |
| 7,553,584 | B2 | 6/2009 | Chiang et al. |
| 7,579,112 | B2 | 8/2009 | Chiang et al. |
| 7,618,742 | B2 | 11/2009 | Kaplin et al. |
| 7,625,198 | B2 | 12/2009 | Lipson et al. |
| 7,945,344 | B2 | 5/2011 | Wang et al. |
| 8,168,326 | B2 | 5/2012 | Chiang et al. |
| 2002/0120906 | A1 | 8/2002 | Xia et al. |
| 2002/0169620 | A1 | 11/2002 | Spotnitz et al. |
| 2003/0064292 | A1 | 4/2003 | Neudecker et al. |
| 2003/0068559 | A1 | 4/2003 | Armstrong et al. |
| 2003/0082446 | A1 | 5/2003 | Chiang et al. |
| 2003/0099884 | A1 | 5/2003 | Chiang et al. |
| 2003/0108800 | A1 | 6/2003 | Barbarich |
| 2004/0131761 | A1 * | 7/2004 | Shakespeare ................. 427/58 |
| 2004/0131925 | A1 | 7/2004 | Jenson et al. |
| 2004/0131937 | A1 | 7/2004 | Chen et al. |
| 2004/0144321 | A1 | 7/2004 | Grace et al. |
| 2004/0151985 | A1 | 8/2004 | Munshi |
| 2004/0185667 | A1 | 9/2004 | Jenson |
| 2004/0258851 | A1 | 12/2004 | Selvamanickam et al. |
| 2005/0079418 | A1 | 4/2005 | Kelley et al. |
| 2005/0114105 | A1 | 5/2005 | Barber |
| 2005/0244580 | A1 | 11/2005 | Cok et al. |
| 2006/0138350 | A1 | 6/2006 | Banine et al. |
| 2006/0156978 | A1 | 7/2006 | Lipson et al. |
| 2007/0110892 | A1 | 5/2007 | Awata et al. |
| 2007/0186852 | A1 | 8/2007 | Sakata et al. |
| 2007/0218329 | A1 | 9/2007 | Keith et al. |
| 2008/0118782 | A1 | 5/2008 | Heller et al. |
| 2008/0187832 | A1 | 8/2008 | Takezawa et al. |
| 2008/0259976 | A1 | 10/2008 | Hrudey et al. |
| 2009/0061090 | A1 | 3/2009 | Negishi |
| 2009/0157369 | A1 | 6/2009 | Li et al. |
| 2009/0217876 | A1 | 9/2009 | Epstein |
| 2009/0304906 | A1 | 12/2009 | Suduo et al. |
| 2009/0326696 | A1 | 12/2009 | Wang et al. |
| 2010/0015361 | A1 | 1/2010 | Negishi |
| 2010/0035152 | A1 | 2/2010 | Sastry et al. |
| 2010/0082142 | A1 | 4/2010 | Usadi et al. |
| 2010/0190051 | A1 | 7/2010 | Aitken et al. |
| 2011/0165326 | A1 | 7/2011 | Little et al. |
| 2011/0202159 | A1 | 8/2011 | Wang et al. |
| 2011/0217578 | A1 | 9/2011 | Albano et al. |
| 2011/0301931 | A1 | 12/2011 | Gering |
| 2011/0318498 | A1 | 12/2011 | Wadley et al. |
| 2012/0040233 | A1 | 2/2012 | Kim et al. |
| 2012/0058280 | A1 | 3/2012 | Chung et al. |

FOREIGN PATENT DOCUMENTS

| | | |
|---|---|---|
| JP | 06-116722 A | 4/1994 |
| JP | 2004-319449 A | 11/2004 |
| JP | 2005-093373 A | 4/2005 |
| JP | 2005-353759 A | 12/2005 |

OTHER PUBLICATIONS

International Search Report and Written Opinion of PCT Application No. PCT/US09/47848 filed on Jun. 18, 2009.

Salvador Aceves et al., "Computer Modeling in the Design and Evaluation of Electric and Hybrid Vehicles", 11th Annual National Educator's Workshop Standard Experiments in Engineering Materials, Science and Technology, Oct. 27-30, 1996, 12 pages retrieved from the Internet: <<http://www.osti.gov/bridge/servlets/purl/381678-Unwv9F/webviewable/381678.pdf>>, Lawrence Livermore National Laboratory, Los Alamos, New Mexico.

Y. H. Chen et al., "Selection of Conductive Additives in Li-Ion Battery Cathodes: A Numerical Study", Journal of the Electrochemical Society, 2007, pp. A978-A986, vol. 154, No. 10, The Electrochemical Society.

Chia-Wei Wang et al., "Mesoscale Modeling of a Li-Ion Polymer Cell," Journal of the Electrochemical Society, 2007, pp. A1035-A1047, vol. 154 No. 11, The Electrochemical Society.

Marc Doyle et al., "Computer Simulations of a Lithium-Ion Polymer Battery and Implications for Higher Capacity Next-Generation Battery Designs", Journal of the Electrochemical Society, 2003, pp. A706-A713, vol. 150 No. 6, The Electrochemical Society.

Gerbrand Ceder et al., "Computational Modeling and Simulation for Rechargeable Batteries", MRS Bulletin, Aug. 2002, pp. 619-623.

Office Action for U.S. Appl. No. 13/086,825 dated Oct. 17, 2012.

Office Action for U.S. Appl. No. 13/086,825 dated Apr. 26, 2013.

Office Action for U.S. Appl. No. 13/415,774 dated Oct. 1, 2013.

European Search Report for Application No. EP 09767760.3-1353 of Jun. 14, 2013.

Office Action for U.S. Appl. No. 13/103,008 dated Jan. 9, 2013.

Office Action for U.S. Appl. No. 13/291,845 dated Nov. 26, 2012.

Office Action for U.S. Appl. No. 13/292,663 dated Aug. 2, 2012.

European Search Report for PCT/US2009/047848 dated Oct. 11, 2012.

Q.H. Zeng et al, "Multiscale modeling and simulation of polymer nanocomposites", Progress in Polymer Science, Dec. 3, 2007, pp. 191-269, vol. 33, No. 2, Pergamon Press, Oxford, Great Britain.

Office Action for U.S. Appl. No. 13/292,663, dated Feb. 27, 2013.

Advisory Action for U.S. Appl. No. 13/103,004, dated Mar. 15, 2013.

Notice of Allowance for U.S. Appl. No. 13/684,429 dated Mar. 15, 2013.

Notice of Allowance for U.S. Appl. No. 13/911,015 dated Aug. 16, 2013.

Japanese Office Action for Japanese Patent Application No. 2011-514817, dated Jan. 24, 2014.

* cited by examiner

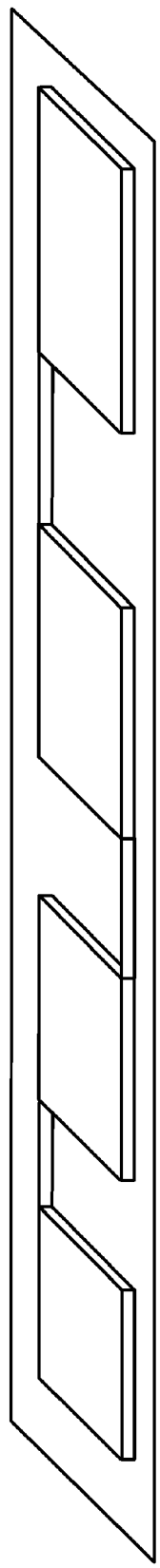
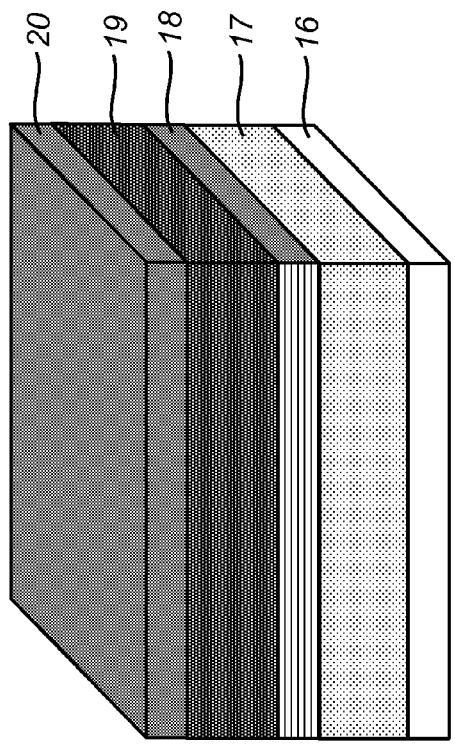
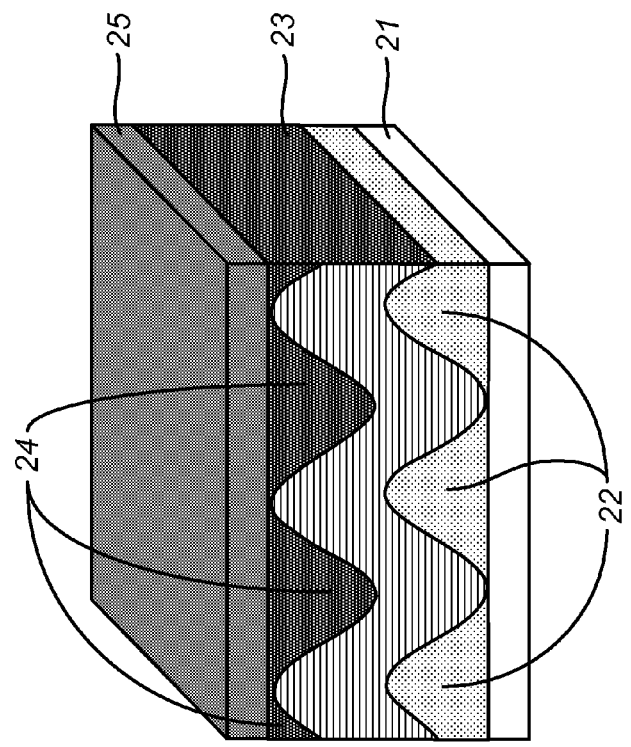
FIG. 5
FIG. 6A
FIG. 6B

METHOD FOR HIGH VOLUME MANUFACTURE OF ELECTROCHEMICAL CELLS USING PHYSICAL VAPOR DEPOSITION

CROSS-REFERENCES TO RELATED APPLICATIONS

This application claims the benefit of U.S. Provisional Patent Application No. 61/074,448, filed Jun. 20, 2008, entitled "Method for High Volume Manufacture of Electrochemical Cells Using Physical Vapor Deposition," the contents of which is hereby incorporated by reference in its entirety.

BACKGROUND OF THE INVENTION

Electrochemical cells are finding ever-increasing use as power supplies for a large number of different applications. Examples of devices commonly run off of battery power include but are not limited to mobile electronic devices such as cell phones, laptop computers, and portable media players. The demand for increased power by these devices has resulted in the fabrication of electrochemical cells from a variety of materials arranged in different architectures.

Conventional approaches to the fabrication of electrochemical cells have formed the elements of an electrochemical cell (such as the anode, cathode, and electrolytic material) by depositing a series of layers. Commonly, these electrochemical cells are fabricated utilizing batch processes, utilizing separate chambers to deposit different layers.

U.S. Pat. No. 5,411,592 describes an apparatus for the formation of thin-film batteries utilizing a substrate that is moved between two rolls. By rotating the rolls, the substrate is moved through a plurality of chambers, in which a film is deposited.

While the approach of the U.S. Pat. No. 5,411,592 may be effective to fabricate an electrochemical cell, it may offer certain disadvantages. One possible disadvantage is bulk, in that each of the films making up the electrochemical cell must be formed in a separate chamber. By allocating each fabrication step to a different chamber, the size of the apparatus is increased.

Moreover, by allocating the formation of each layer of the electrochemical cell to a different chamber, the apparatus of U.S. Pat. No. 5,411,592 may suffer from a lack of flexibility. Specifically, a change in the structure of the electrochemical cell requires a new device with different chambers to be created. Where batteries are to be formed from different materials or with different architectures, the conventional batch-type apparatuses may be impractical.

From the above, it is seen that cost effective and efficient techniques for manufacturing of semiconductor materials are desirable.

SUMMARY OF THE INVENTION

Embodiments of the present invention relate to apparatuses and methods for fabricating electrochemical cells. One embodiment of the present invention comprises a single chamber configurable to deposit different materials on a substrate spooled between two reels. In one embodiment, the substrate is moved in the same direction around the reels, with conditions within the chamber periodically changed to result in the continuous build-up of deposited material over time. Another embodiment employs alternating a direction of movement of the substrate around the reels, with conditions in the chamber differing with each change in direction to result in the sequential build-up of deposited material over time. The chamber is equipped with different sources of energy and materials to allow the deposition of the different layers of the electrochemical cell.

According to an embodiment of the present invention, an apparatus for deposition of electrochemical cells is provided. The apparatus includes a deposition chamber in fluid communication with a first material source and with a second material source, a first gate in fluid communication with the deposition chamber and configured to be maintained under gas and pressure conditions similar to conditions within the deposition chamber, and a second gate in fluid communication with the deposition chamber and configured to be maintained under gas and pressure conditions similar to conditions within the deposition chamber. A substrate is positioned between two reels and extending through the first gate, the deposition chamber, and the second gate, and a controller is configured to rotate the reels in concert to move the substrate in a direction through the deposition chamber while material from the material source is deposited on the substrate.

According to another embodiment of the present invention, a process for forming an electrochemical cell is provided. The process includes moving a substrate spooled between two reels in a first direction through a deposition chamber, depositing an anode or a cathode layer on the substrate in the chamber under a first set of deposition conditions, and moving the anode or cathode layer back into the chamber. An electrolyte layer is deposited over the anode or cathode layer within the chamber under a second set of deposition condition. The electrolyte layer is moved back into the chamber, and an other of the anode or cathode layer is deposited over the electrolyte layer within the chamber under a third set of deposition conditions, to form the electrochemical cell.

According to a specific embodiment of the present invention, an apparatus for forming an electrochemical cell is provided. The apparatus includes a substrate spooled between two reels through a deposition chamber, a controller in electronic communication with the reels and the deposition chamber, and a computer-readable storage medium in electronic communication with the controller. The computer readable storage medium has stored thereon, code directed to instruct the controller to move a substrate through the deposition chamber in a first direction, instruct the deposition chamber to deposit an anode or a cathode layer on the substrate in the chamber under a first set of deposition conditions, and instruct the reels to move the anode or cathode layer back into the chamber. Code stored on the computer-readable storage medium instructs the deposition chamber to deposit an electrolyte layer over the anode or cathode layer within the chamber under a second set of deposition condition, instructs the reels to move the electrolyte layer back into the chamber; and instructs the deposition chamber to deposit an other of the anode or cathode layer over the electrolyte layer within the chamber under a third set of deposition conditions, to form the electrochemical cell.

According to another specific embodiment of the present invention, a method for depositing material on a substrate is provided. The method includes passing materials through evaporation sources for heating to provide a vapor using at least one method selected from the group consisting of evaporation, physical vapor deposition, chemical vapor deposition, sputtering, radio frequency magnetron sputtering, microwave plasma enhanced chemical vapor deposition (MPECVD), pulsed laser deposition (PLD), laser ablation, spray deposition, spray pyrolysis, spray coating or plasma spraying. Oxygen gas or other oxidizing species is passed into the evaporation chamber to mix with the material vapor and create an oxide to be deposited. Nitrogen gas or other species is passed into the evaporation chamber to mix with the material vapor and create a nitrate to be deposited, and a substrate is conveyed adjacent the evaporation sources for deposition of the vapor onto the substrate.

Further understanding of the nature and advantages of the present invention may be realized by reference to the latter portions of the specification and attached drawings.

BRIEF DESCRIPTION OF THE DRAWINGS

FIG. 5 shows an example of plurality of discrete electrochemical cells on a substrate and connected by leads.

FIG. 6A is a simplified cross-sectional view showing an electrochemical cell formed according to an embodiment of the present invention having electrodes with a flat thin-film morphological design.

FIG. 6B is a simplified cross-sectional view showing an electrochemical cell formed according to an embodiment of the present invention having electrodes with a sinusoidal shaped morphological design.

DETAILED DESCRIPTION OF SPECIFIC EMBODIMENTS

Figure 1:
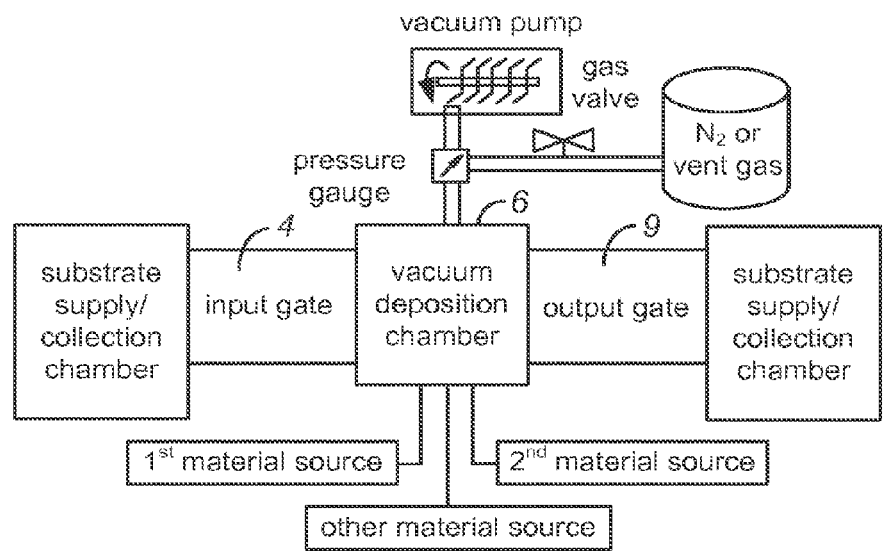
FIG. 1 is a simplified schematic diagram illustrating an apparatus for depositing battery material onto a substrate according to an embodiment of the present invention.

Embodiments in accordance with the present invention relate to techniques for manufacturing electrochemical cells. FIG. 1 is a simplified schematic diagram illustrating an apparatus for depositing battery material onto a substrate according to an embodiment of the present invention.

In particular, the apparatus of FIG. 1 comprises a vacuum deposition chamber 6. The vacuum deposition chamber is configured to deposit thin films of materials making up an electrochemical cell. In particular, the vacuum deposition chamber is in fluid communication with a plurality of material sources allowing deposition of one or more of the following layers: an anode, a cathode, an electrolyte, a current collector, and a lead connecting one or more discrete electrochemical cells.

Specifically, the vacuum deposition chamber is configured to have at least one evaporation source to deposit a layer of battery cathode material onto a current collector. The current collector may be provided on the substrate ready-made, or may itself be formed utilizing the deposition chamber.

The deposition chamber is also configured to have at least one evaporation source to deposit a layer of electrolyte material onto the cathode battery material. The electrolyte material may be deposited as a gel or in the solid-state. The deposition chamber is also configured to have at least one evaporation source to deposit a layer of battery anode material onto the electrolyte layer.

The deposition chamber is provided with input and output gas gates 4 and 9 respectively. These gas gates maintain an inert or oxidizing vacuum atmosphere in the chamber during deposition.

Figure 2:
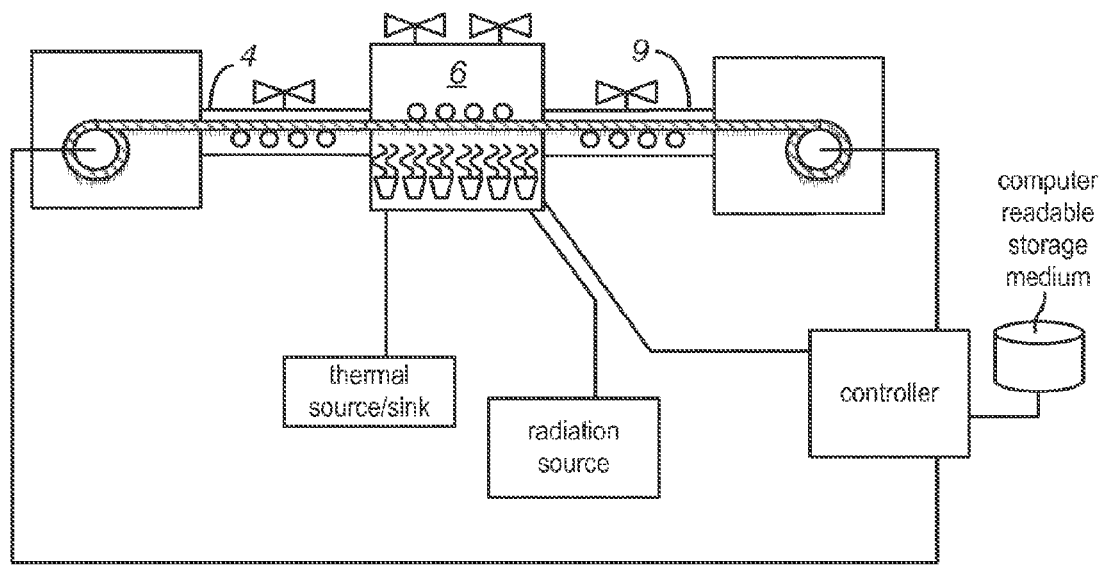
FIG. 2 is a simplified view of a particular embodiment of an apparatus in accordance with the present invention.

FIG. 2 shows a more detailed view of an embodiment of an apparatus in accordance with the present invention. As shown in FIG. 2, one embodiment of the present invention comprises a processing chamber configurable to deposit different materials on a substrate spooled between two reels.

The apparatus may include a gas supply such that an oxidizing atmosphere can be maintained as needed at the same time of deposition. A gas supply valve connected to the deposition chamber, may allow a reactive gas atmosphere to be maintained as needed at the same time of deposition. Another gas supply valve, connected to the deposition chamber, may allow an inert gas atmosphere to be maintained in the chamber while the processed substrate is moved out of the chamber.

The chamber is equipped with different sources of energy and materials to allow the deposition of the different layers of the electrochemical cell. For example, the chamber may be equipped with heating or cooling elements to control the thermal environment therein. These temperature control elements may be global, for example in the form of heat lamps or peltier heaters or coolers. Alternatively, or in conjunction with global heat sources/sinks, the apparatus may be equipped with localized temperature control elements, such as lasers or jets of cryogenic fluids, that are able to be directed at specific portions of the deposited materials.

The chamber may also be equipped to expose the materials therein to radiation. Examples of radiation sources in accordance with the present invention include but are not limited to UV radiation sources, microwave radiation sources, and electron beams. Other possible sources of radiation for use in the chamber include infrared radiation sources, pulsed lasers, nanosecond lasers, low energy lasers (for example having a power on the order of $mJ/cm^2$) and high energy lasers (for example having a power on the order of $J/cm^2$), and neutron, electrons, photons or other atomic particles scattering.

The apparatus includes a supply chamber connected in series with the deposition chamber. A substrate material is fed to the deposition chamber. The substrate material is kept in the same gas atmosphere of the deposition chamber and it is unrolled and passed to the deposition chamber continuously or sequentially.

The input/output gates may comprise evacuation chambers connected in series with the deposition chamber and kept at the same gas atmosphere. The substrate material, upon which the battery has been deposited, passes through the evacuation chamber and is collected in a roll.

This embodiment of the apparatus can be adapted to deposit a stack of solid state battery cells onto the substrate. In this embodiment, the supply and evacuation chambers are reversible. Therefore, when the roll of substrate material has undergone one pass through the deposition chamber, the direction of the substrate can be reversed and the substrate passed through the deposition chamber again to allow formation of another layer of the electrochemical cell.

Thus, in the particular embodiment shown in FIG. 2, a direction of movement of the substrate around the reels is alternated. Conditions within the chamber are varied with each change in direction, in order to result in the sequential build-up of deposited material over time. In particular, a controller is in electrical communication with each of the reels and the chamber. The controller is also in communication with a computer readable storage medium, having stored thereon code configured to direct the alternating movement of the substrate in conjunction with deposition of the different layers of material of the electrochemical cell.

Figure 2A:
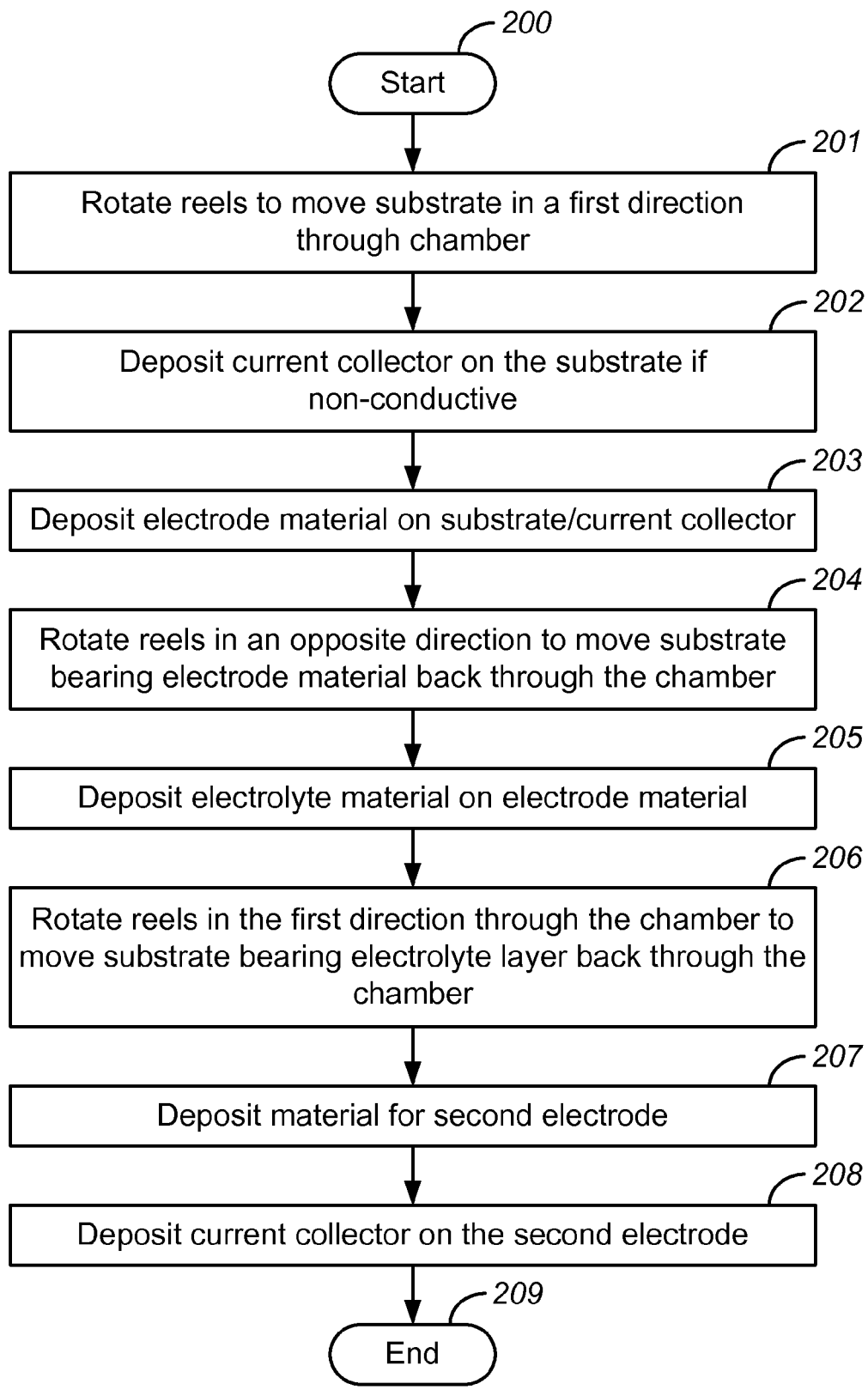
FIG. 2A is a simplified flow diagram showing steps of an embodiment of a process for forming an electrochemical cell utilizing the apparatus of FIG. 2.

FIG. 2A is a simplified diagram showing the steps of a process flow 200 of forming a battery structure utilizing this approach. Specifically, in a first step 201, the reels are rotated to move a substrate in a first direction through the deposition chamber.

In a second step 202, the current collector material is deposited on the substrate if the substrate is not electrically conducting. In a third step 203, the material of a first electrode is deposited on the substrate. In certain embodiments, the material of the anode is deposited first. In other embodiments, the material of the cathode may be deposited first.

In a fourth step 204, the direction of rotation of the reels is changed, and the substrate bearing the deposited electrode material is moved in the opposite direction back through the chamber. In fifth step 205, the material of the electrolyte is deposited over the first electrode.

In a sixth step 206, the direction of rotation of the reels is again reversed to the original direction, and the substrate bearing the deposited electrolyte material is again moved back through the chamber. In seventh step 207, the material of the second electrode (anode or cathode) is deposited over the electrolyte. In an eighth step 208, the material of the current collector is deposited on the second electrode.

The above sequence of steps provides a process according to an embodiment of the present invention. As shown, the method uses a combination of steps including a changes in direction of the movement of the substrate through the chamber, coupled with changes in deposition conditions within the chamber. Other alternatives can also be provided where steps are added, one or more steps are removed, or one or more steps are provided in a different sequence without departing from the scope of the claims herein. Further details of the present method can be found throughout the present specification.

Figure 2B:
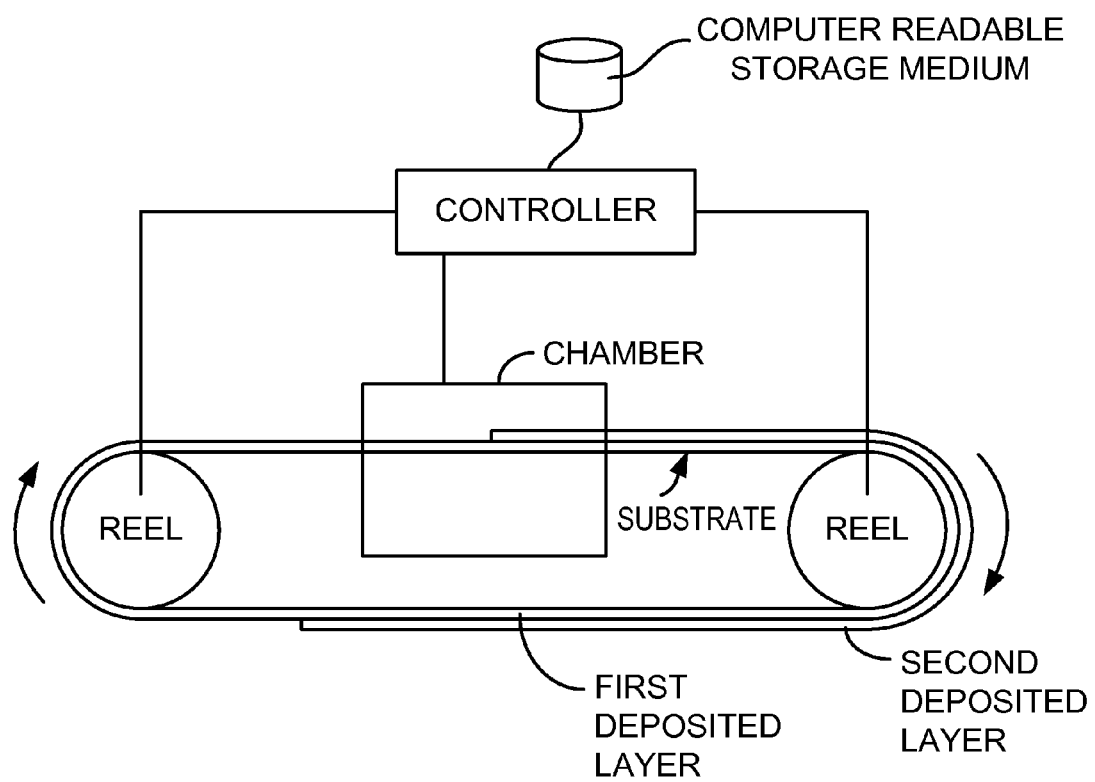
FIG. 2B is a simplified view of an alternative embodiment of an apparatus in accordance with the present invention.

In an alternative approach, the substrate may be moved in the same direction around the reels, with conditions within the chamber periodically changed to result in the continuous build-up of deposited material over time. FIG. 2B shows a simplified schematic view of an embodiment of an apparatus configured to form a battery structure according to such an approach. In particular, a controller is in electrical communication with the reels and the deposition chamber. The controller is also in communication with a computer readable storage medium having stored thereon code to direct the controller to consistently rotate the reels in the same direction to first form an electrode layer. After a certain amount of time when the substrate is covered with the electrode layer, code stored on the computer readable storage medium causes the controller to instruct the chamber to change the deposition conditions to deposit an electrolyte layer. Subsequently, the controller instructs the deposition chamber to change conditions within the chamber yet again to deposit the material of the other of the electrodes (anode or cathode).

Figure 2C:
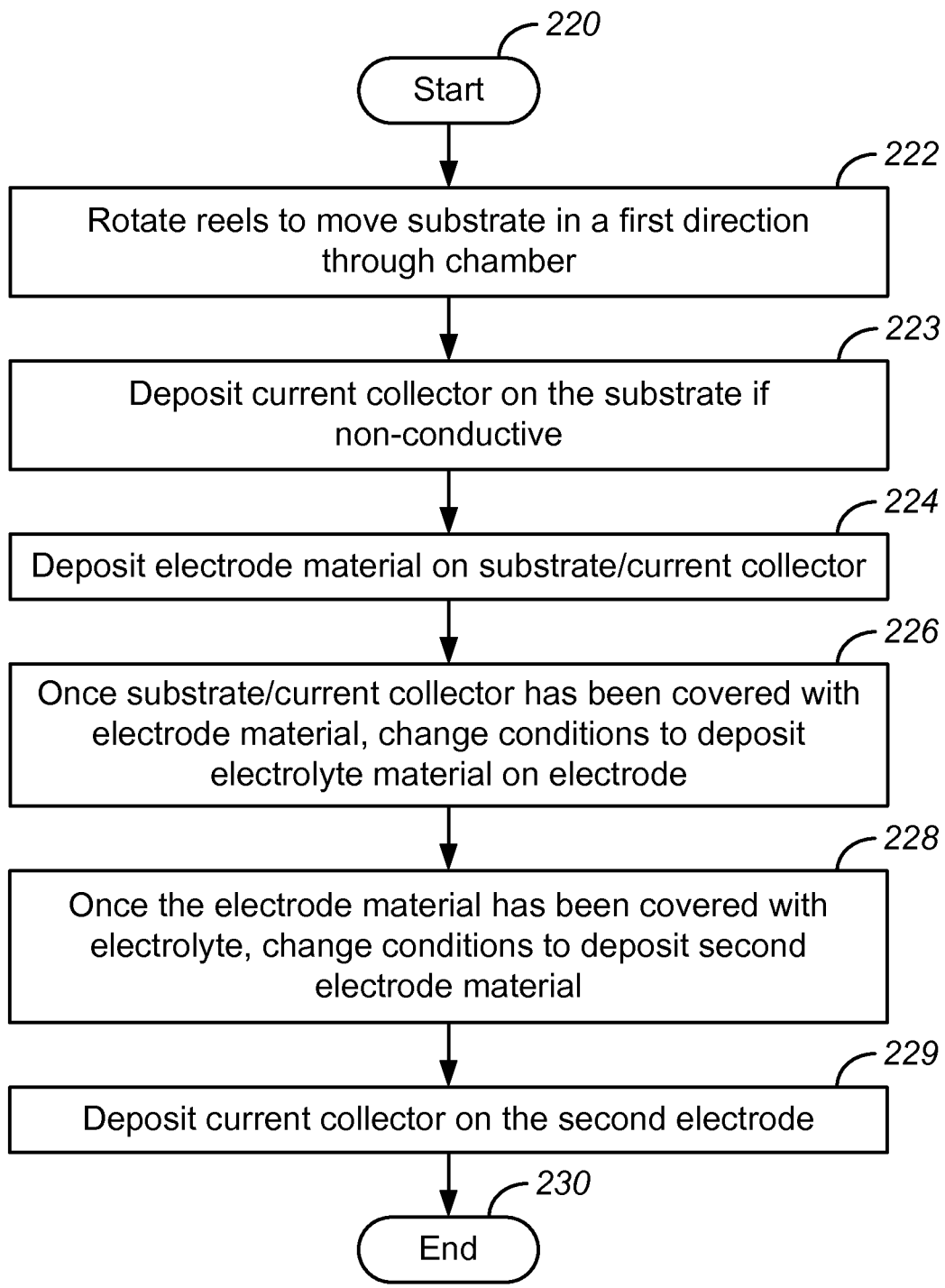
FIG. 2C is a simplified flow diagram showing steps of an embodiment of a process for forming an electrochemical cell utilizing the apparatus of FIG. 2B.

FIG. 2C is a simplified chart summarizing the flow 220 of steps of forming a battery structure utilizing this approach. In a first step 222, the reels are rotated to move the substrate through the chamber. In a second step 223, while the reels are being rotated in the same direction, a current collector material is deposited on the substrate if the substrate is not electrically conducting.

In a third step 224, while the reels are being rotated in the same direction, an electrode material (anode or cathode) is deposited on the substrate, or the current collector material if the substrate is non-conducting. In a fourth step 226, once the substrate has been covered with the electrode material, conditions within the chamber are changed to deposit an electrolyte material on the electrode.

In a fifth step 228, once the first electrode material has been covered with the electrolyte, conditions within the chamber are again changed and a second (cathode or anode) material is deposited. In a sixth step 229, the current collector material is deposited on the second electrode.

The above sequence of steps provides a process according to an embodiment of the present invention. As shown, the method uses a combination of steps including movement of the substrate through the chamber in a consistent direction, coupled with changes in deposition conditions within the chamber. Other alternatives can also be provided where steps are added, one or more steps are removed, or one or more steps are provided in a different sequence without departing from the scope of the claims herein. Further details of the present method can be found throughout the present specification.

The deposition chamber may be configured to deposit materials by at least one method selected from evaporation, physical vapor deposition (PVD), chemical vapor deposition (CVD), sputtering, radio frequency magnetron sputtering, microwave plasma enhanced chemical vapor deposition (MPECVD), pulsed laser deposition (PLD), laser ablation, spray deposition, spray pyrolysis, spray coating, or plasma spraying.

Conditions for deposition may, but need not, take place in a reduced pressure environment. Thus, the deposition chamber may be the deposition chamber may be configured to deposit materials by at least one In particular embodiments, the apparatus is configured to deposit materials utilizing microwave hydrothermal synthesis to create nanoparticles. Nanoparticles deposited according to embodiments of the present invention may exhibit at least one of the shapes selected from the group consisting of: spheres, nanocubes, pseudocubes, ellipsoids, spindles, nanosheets, nanorings, nanospheres, nanospindles, dots, rods, wires, arrays, tubes, nanotubes, belts, disks, rings, cubes, mesopores, dendrites, propellers, flowers, hollow interiors, hybrids of the listed structures, and other complex superstructures. Particular embodiment of apparatuses according to the present invention can be configured to deposit particles using microwave exposure to induce at least one of the following mechanisms: nucleation, aggregation, recrystallization, and dissolution-recrystallization.

In particular embodiments, the apparatus may be configured to deposit materials utilizing laser ablation, thermal evaporation, vapor transport, or a combination of these techniques, to deposit nanowire, nanotube, or nanobelt structures, or a combination of them. The materials that can be deposited in these embodiments include, but are not limited to, Group III-IV semiconductor nanowires (e.g. silicon), zinc (Zn) and zinc oxide (ZnO) nanowires, nanobelts of semiconducting oxides (oxides of zinc, tin, indium, cadmium, and gallium), carbon nanotubes and carbon meso-structures.

Embodiments of the present invention may offer a number of benefits over conventional approaches. For example, embodiments of the present invention facilitate the scalable manufacture of single or multiple, high-performance, thin-film electrochemical cells, particularly as compared with conventional batch-type manufacturing processes.

Embodiments of the present invention also offer a high degree of flexibility as compared with conventional approaches. In particular, embodiments of the present invention allow multiple manufacturing techniques to be employed utilizing a single chamber. This approach creates a system that is capable of utilizing multiple deposition techniques specific to optimized layers or graded materials, within one or multiple cells.

Certain embodiments of the present invention allow for the fabrication of a plurality of electrochemical cells in a vertical (stacked) configuration. Thus, particular embodiments of the present invention may also include at least one evaporation source adapted to deposit current collector layers between the second electrode of a first deposited battery and the first electrode of the next deposited battery in a stack, and also a top conductive metal layer upon the second electrode of the last deposited battery in a stack.

Figure 3A:
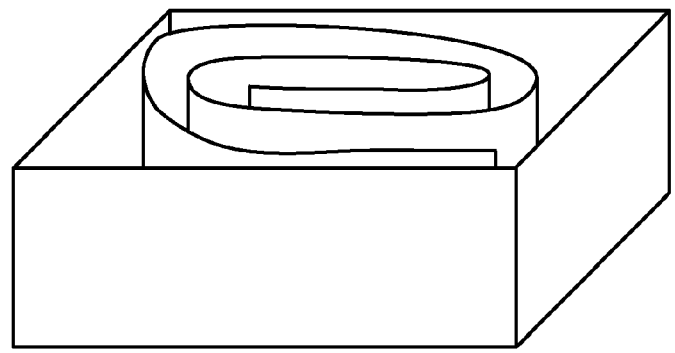
FIG. 3A shows an example of a battery in a wound prismatic form.
Figure 3B:
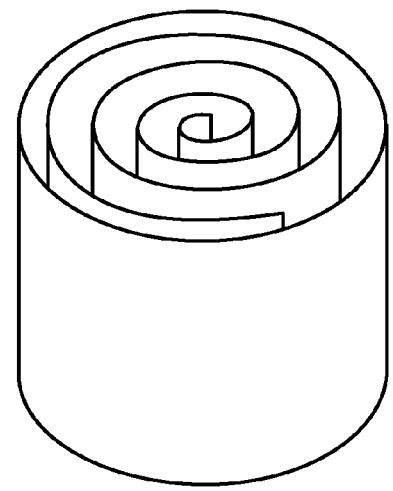
FIG. 3B shows an example of a battery in a wound cylindrical form.

Alternatively, embodiments of the present invention may allow for the horizontal formation of batteries/electrochemical cells on a ribbon-type substrate. In particular embodiments, such a ribbon may be coiled in a wound prismatic form, as is shown in FIG. 3A. In alternative embodiments, such a ribbon may be coiled in a wound cylindrical form, as is shown in FIG. 3B.

Figure 4:
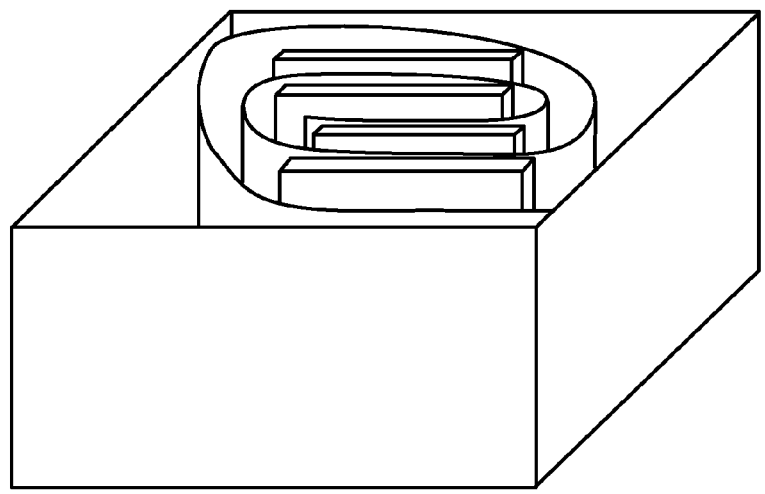
FIG. 4 shows the location of an electrochemical cells formed on a coiled substrate in accordance with one embodiment.
Figure 7:
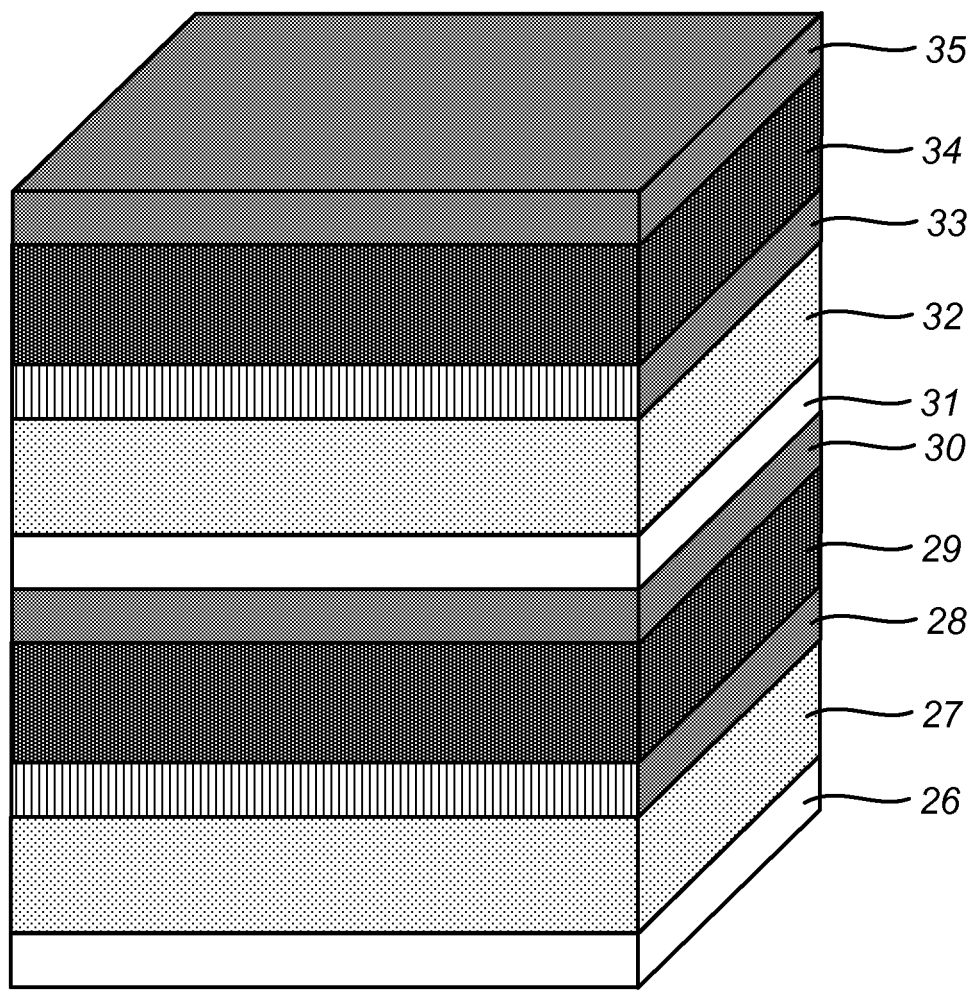
FIG. 7 is a simplified cross-sectional view showing an embodiment of a stacked electrochemical cell formed according to an embodiment of the present invention.

As shown in FIG. 4, in certain embodiments the deposition of materials on the substrate may be limited to particular locations. In particular, deposited materials may be excluded from portions of the substrate expected to be the location of a sharp turn in the coil, thereby avoiding high stresses and possible defects associated with winding.

In particular embodiments, a plurality of electrochemical cells may be formed in a horizontal series on a ribbon-type substrate, with electrical communication between the discrete electrochemical cells established through conducting lead structures. Such a embodiment is shown in FIG. 5.

Where such leads are relatively thin and fragile, the tight turns of a coil could impose physical stress on them, possibly resulting in fracture. Accordingly, particular embodiments of the present invention may space the discrete batteries/cells with increasing spacing. Such spacing would accommodate a larger amount of material in successive turns as the material is wound, reducing physical stress.

EXAMPLES

Example 1

Manufacture of a Thin-Film Li Battery

This example demonstrates the process of manufacturing a new electrochemical cell. In particular, two different morphological designs of electrodes are shown. FIG. 6A is a simplified cross-sectional view showing an electrochemical cell formed according to an embodiment of the present invention having electrodes with a flat thin-film morphological design. FIG. 6B is a simplified cross-sectional view showing an electrochemical cell formed according to an embodiment of the present invention having electrodes with a sinusoidal shaped morphological design.

The materials for the three-dimensional electrochemical cells are copper as anode current collector (16 in FIG. 6A, 21 in FIG. 6B), lithium metal as anode (17 in FIG. 6A, 22 in FIG. 6B), polymer with lithium salts as the electrolyte (18 in FIG. 6A, 23 in FIG. 6B), lithium manganese oxide as cathode (19 in FIG. 6A, 24 in FIG. 6B), and aluminum as cathode current collector (20 in FIG. 6A, 25 in FIG. 6B). Because a polymer electrolyte is used, a separator is unnecessary.

These materials used here are for illustrative purposes only. In accordance with alternative embodiments, other materials could be used to form the electrochemical cell and still remain within the scope of the present invention.

In the flat electrode configuration of FIG. 6A, the substrate is the first current collector (copper). Successive layers of materials, active and inactive, are deposited via PVD on the substrate in the deposition chamber.

In the sinusoidal configuration, a ridged polymeric film is used as the substrate. A first metallic layer (copper) is deposited on the substrate, followed by successive layers of materials, active and inactive, which are deposited via PVD in the chamber.

Example 2

Manufacture of a Stacked Set of Cells, Producing a Higher Voltage, and Energy, Battery This example demonstrates the process of manufacturing a stacked cell. FIG. 6 shows two flat thin-film cells stacked together. The materials for the three-dimensional electrochemical cells are copper as anode current collector (26 and 31), lithium metal as anode (27 and 32), polymer with lithium salts as the electrolyte (28 and 33), lithium manganese oxide as cathode (29 and 34), and aluminum as cathode current collector (30 and 35). Because a polymer electrolyte is used, a separator is not required.

The particular materials listed here are for illustrative purposes only. Other materials could be employed by alternative embodiments and still remain within the scope of the present invention.

In this particular example, multiple layers are deposited in sequence using the first flat metallic layer (copper current collector) as the substrate. PVD is used to deposit the successive active and inactive materials.

While the above-embodiments describe electrochemical cells fabricated from particular materials, the present invention is not limited to the use of such materials. Alternative embodiments could deposit a wide variety of deposited materials for the anode, electrolyte, and cathode, and remain within the scope of the present invention. For example, TABLE 1 is a non-exhaustive list of examples of the materials making up various types of electrolytic cells.

TABLE 1

| SUBSTRATE | ANODE | ELECTROLYTE | CATHODE | CURRENT COLLECTOR | LEAD |
|---|---|---|---|---|---|
| copper (Cu) foil | graphite (C) | lithium phosphorus oxynitride (LIPON) | layered metal oxide materials (e.g. $LiCoO_2$) | aluminum (Al) | copper (Cu) |
| copper (Cu) foil | graphite (C) | lithium phosphorus oxynitride (LIPON) | spinel materials (e.g. $LiMn_2O_4$) | aluminum (Al) | copper (Cu) |

TABLE 1-continued

| SUBSTRATE | ANODE | ELECTROLYTE | CATHODE | CURRENT COLLECTOR | LEAD |
|---|---|---|---|---|---|
| copper (Cu) foil | graphite (C) | lithium phosphorus oxynitride (LIPON) | olivine materials (e.g. LiFePO$_4$) | aluminum (Al) | copper (Cu) |
| copper (Cu) foil | graphite (C) | lithium phosphorus oxynitride (LIPON) | Li(Ni$_{1/3}$Mn$_{1/3}$Co$_{1/3}$)O$_2$ | aluminum (Al) | copper (Cu) |
| copper (Cu) foil | graphite (C) | lithium phosphorus oxynitride (LIPON) | LiNi$_x$Co$_y$Al$_{(1-x-y)}$O$_2$ (NCA) | aluminum (Al) | copper (Cu) |
| copper (Cu) foil | graphite (C) | lithium phosphorus oxynitride (LIPON) | LiNi$_x$Mn$_y$Co$_{(1-x-y)}$O$_2$ (NCM) | aluminum (Al) | copper (Cu) |
| copper (Cu) foil | meso-carbon (C) | lithium phosphorus oxynitride (LIPON) | layered metal oxide materials (e.g. LiCoO$_2$) | aluminum (Al) | copper (Cu) |
| copper (Cu) foil | meso-carbon (C) | lithium phosphorus oxynitride (LIPON) | spinel materials (e.g. LiMn$_2$O$_4$) | aluminum (Al) | copper (Cu) |
| copper (Cu) foil | meso-carbon (C) | lithium phosphorus oxynitride (LIPON) | olivine materials (e.g. LiFePO$_4$) | aluminum (Al) | copper (Cu) |
| copper (Cu) foil | meso-carbon (C) | lithium phosphorus oxynitride (LIPON) | Li(Ni$_{1/3}$Mn$_{1/3}$Co$_{1/3}$)O$_2$ | aluminum (Al) | copper (Cu) |
| copper (Cu) foil | meso-carbon (C) | lithium phosphorus oxynitride (LIPON) | LiNi$_x$Co$_y$Al$_{(1-x-y)}$O$_2$ (NCA) | aluminum (Al) | copper (Cu) |
| copper (Cu) foil | meso-carbon (C) | lithium phosphorus oxynitride (LIPON) | LiNi$_x$Mn$_y$Co$_{(1-x-y)}$O$_2$ (NCM) | aluminum (Al) | copper (Cu) |
| copper (Cu) foil | lithium titanium oxide (Li$_4$Ti$_5$O$_{12}$) | lithium phosphorus oxynitride (LIPON) | layered metal oxide materials (e.g. LiCoO$_2$) | aluminum (Al) | copper (Cu) |
| copper (Cu) foil | lithium titanium oxide (Li$_4$Ti$_5$O$_{12}$) | lithium phosphorus oxynitride (LIPON) | spinel materials (e.g. LiMn$_2$O$_4$) | aluminum (Al) | copper (Cu) |
| copper (Cu) foil | lithium titanium oxide (Li$_4$Ti$_5$O$_{12}$) | lithium phosphorus oxynitride (LIPON) | olivine materials (e.g. LiFePO$_4$) | aluminum (Al) | copper (Cu) |
| copper (Cu) foil | lithium titanium oxide (Li$_4$Ti$_5$O$_{12}$) | lithium phosphorus oxynitride (LIPON) | Li(Ni$_{1/3}$Mn$_{1/3}$Co$_{1/3}$)O$_2$ | aluminum (Al) | copper (Cu) |
| copper (Cu) foil | lithium titanium oxide (Li$_4$Ti$_5$O$_{12}$) | lithium phosphorus oxynitride (LIPON) | LiNi$_x$Co$_y$Al$_{(1-x-y)}$O$_2$ (NCA) | aluminum (Al) | copper (Cu) |
| copper (Cu) foil | lithium titanium oxide (Li$_4$Ti$_5$O$_{12}$) | lithium phosphorus oxynitride (LIPON) | LiNi$_x$Mn$_y$Co$_{(1-x-y)}$O$_2$ (NCM) | aluminum (Al) | copper (Cu) |
| copper (Cu) foil | lithium metal (Li) | lithium phosphorus oxynitride (LIPON) | layered metal oxide materials (e.g. LiCoO$_2$) | aluminum (Al) | copper (Cu) |
| copper (Cu) foil | lithium metal (Li) | lithium phosphorus oxynitride (LIPON) | spinel materials (e.g. LiMn$_2$O$_4$) | aluminum (Al) | copper (Cu) |
| copper (Cu) foil | lithium metal (Li) | lithium phosphorus oxynitride (LIPON) | olivine materials (e.g. LiFePO$_4$) | aluminum (Al) | copper (Cu) |
| copper (Cu) foil | lithium metal (Li) | lithium phosphorus oxynitride (LIPON) | Li(Ni$_{1/3}$Mn$_{1/3}$Co$_{1/3}$)O$_2$ | aluminum (Al) | copper (Cu) |
| copper (Cu) foil | lithium metal (Li) | lithium phosphorus oxynitride (LIPON) | LiNi$_x$Co$_y$Al$_{(1-x-y)}$O$_2$ (NCA) | aluminum (Al) | copper (Cu) |
| copper (Cu) foil | lithium metal (Li) | lithium phosphorus oxynitride (LIPON) | LiNi$_x$Mn$_y$Co$_{(1-x-y)}$O$_2$ (NCM) | aluminum (Al) | copper (Cu) |
| copper (Cu) foil | graphite (C) | lithium salts/polyethylene oxide (PEO), lithium salts/polyvinylidene fluoride (PVDF), lithium salts/PEO/PVDF | layered metal oxide materials (e.g. LiCoO$_2$) | aluminum (Al) | copper (Cu) |
| copper (Cu) foil | graphite (C) | lithium salts/polyethylene oxide (PEO), lithium salts/polyvinylidene fluoride (PVDF), lithium salts/PEO/PVDF | spinel materials (e.g. LiMn$_2$O$_4$) | aluminum (Al) | copper (Cu) |
| copper (Cu) foil | graphite (C) | lithium salts/polyethylene oxide (PEO), lithium salts/polyvinylidene fluoride (PVDF), lithium salts/PEO/PVDF | olivine materials (e.g. LiFePO$_4$) | aluminum (Al) | copper (Cu) |

TABLE 1-continued

| SUBSTRATE | ANODE | ELECTROLYTE | CATHODE | CURRENT COLLECTOR | LEAD |
|---|---|---|---|---|---|
| copper (Cu) foil | graphite (C) | lithium salts/polyethylene oxide (PEO), lithium salts/polyvinylidene fluoride (PVDF), lithium salts/PEO/PVDF | $Li(Ni_{1/3}Mn_{1/3}Co_{1/3})O_2$ | aluminum (Al) | copper (Cu) |
| copper (Cu) foil | graphite (C) | lithium salts/polyethylene oxide (PEO), lithium salts/polyvinylidene fluoride (PVDF), lithium salts/PEO/PVDF | $LiNi_xCo_yAl_{(1-x-y)}O_2$ (NCA) | aluminum (Al) | copper (Cu) |
| copper (Cu) foil | graphite (C) | lithium salts/polyethylene oxide (PEO), lithium salts/polyvinylidene fluoride (PVDF), lithium salts/PEO/PVDF | $LiNi_xMn_yCo_{(1-x-y)}O_2$ (NCM) | aluminum (Al) | copper (Cu) |
| copper (Cu) foil | mesocarbon (C) | lithium salts/polyethylene oxide (PEO), lithium salts/polyvinylidene fluoride (PVDF), lithium salts/PEO/PVDF | layered metal oxide materials (e.g. $LiCoO_2$) | aluminum (Al) | copper (Cu) |
| copper (Cu) foil | mesocarbon (C) | lithium salts/polyethylene oxide (PEO), lithium salts/polyvinylidene fluoride (PVDF), lithium salts/PEO/PVDF | spinel materials (e.g. $LiMn_2O_4$) | aluminum (Al) | copper (Cu) |
| copper (Cu) foil | mesocarbon (C) | lithium salts/polyethylene oxide (PEO), lithium salts/polyvinylidene fluoride (PVDF), lithium salts/PEO/PVDF | olivine materials (e.g. $LiFePO_4$) | aluminum (Al) | copper (Cu) |
| copper (Cu) foil | mesocarbon (C) | lithium salts/polyethylene oxide (PEO), lithium salts/polyvinylidene fluoride (PVDF), lithium salts/PEO/PVDF | $Li(Ni_{1/3}Mn_{1/3}Co_{1/3})O_2$ | aluminum (Al) | copper (Cu) |
| copper (Cu) foil | mesocarbon (C) | lithium salts/polyethylene oxide (PEO), lithium salts/polyvinylidene fluoride (PVDF), lithium salts/PEO/PVDF | $LiNi_xCo_yAl_{(1-x-y)}O_2$ (NCA) | aluminum (Al) | copper (Cu) |
| copper (Cu) foil | mesocarbon (C) | lithium salts/polyethylene oxide (PEO), lithium salts/polyvinylidene fluoride (PVDF), lithium salts/PEO/PVDF | $LiNi_xMn_yCo_{(1-x-y)}O_2$ (NCM) | aluminum (Al) | copper (Cu) |
| copper (Cu) foil | lithium titanium oxide ($Li_4Ti_5O_{12}$) | lithium salts/polyethylene oxide (PEO), lithium salts/polyvinylidene fluoride (PVDF), lithium salts/PEO/PVDF | layered metal oxide materials (e.g. $LiCoO_2$) | aluminum (Al) | copper (Cu) |
| copper (Cu) foil | lithium titanium oxide ($Li_4Ti_5O_{12}$) | lithium salts/polyethylene oxide (PEO), lithium salts/polyvinylidene fluoride (PVDF), lithium salts/PEO/PVDF | spinel materials (e.g. $LiMn_2O_4$) | aluminum (Al) | copper (Cu) |
| copper (Cu) foil | lithium titanium oxide ($Li_4Ti_5O_{12}$) | lithium salts/polyethylene oxide (PEO), lithium salts/polyvinylidene fluoride (PVDF), lithium salts/PEO/PVDF | olivine materials (e.g. $LiFePO_4$) | aluminum (Al) | copper (Cu) |

TABLE 1-continued

| SUBSTRATE | ANODE | ELECTROLYTE | CATHODE | CURRENT COLLECTOR | LEAD |
|---|---|---|---|---|---|
| copper (Cu) foil | lithium titanium oxide ($Li_4Ti_5O_{12}$) | lithium salts/polyethylene oxide (PEO), lithium salts/polyvinylidene fluoride (PVDF), lithium salts/PEO/PVDF | $Li(Ni_{1/3}Mn_{1/3}Co_{1/3})O_2$ | aluminum (Al) | copper (Cu) |
| copper (Cu) foil | lithium titanium oxide ($Li_4Ti_5O_{12}$) | lithium salts/polyethylene oxide (PEO), lithium salts/polyvinylidene fluoride (PVDF), lithium salts/PEO/PVDF | $LiNi_xCo_yAl_{(1-x-y)}O_2$ (NCA) | aluminum (Al) | copper (Cu) |
| copper (Cu) foil | lithium titanium oxide ($Li_4Ti_5O_{12}$) | lithium salts/polyethylene oxide (PEO), lithium salts/polyvinylidene fluoride (PVDF), lithium salts/PEO/PVDF | $LiNi_xMn_yCo_{(1-x-y)}O_2$ (NCM) | aluminum (Al) | copper (Cu) |
| copper (Cu) foil | lithium metal (Li) | lithium salts/polyethylene oxide (PEO), lithium salts/polyvinylidene fluoride (PVDF), lithium salts/PEO/PVDF | layered metal oxide materials (e.g. $LiCoO_2$) | aluminum (Al) | copper (Cu) |
| copper (Cu) foil | lithium metal (Li) | lithium salts/polyethylene oxide (PEO), lithium salts/polyvinylidene fluoride (PVDF), lithium salts/PEO/PVDF | spinel materials (e.g. $LiMn_2O_4$) | aluminum (Al) | copper (Cu) |
| copper (Cu) foil | lithium metal (Li) | lithium salts/polyethylene oxide (PEO), lithium salts/polyvinylidene fluoride (PVDF), lithium salts/PEO/PVDF | olivine materials (e.g. $LiFePO_4$) | aluminum (Al) | copper (Cu) |
| copper (Cu) foil | lithium metal (Li) | lithium salts/polyethylene oxide (PEO), lithium salts/polyvinylidene fluoride (PVDF), lithium salts/PEO/PVDF | $Li(Ni_{1/3}Mn_{1/3}Co_{1/3})O_2$ | aluminum (Al) | copper (Cu) |
| copper (Cu) foil | lithium metal (Li) | lithium salts/polyethylene oxide (PEO), lithium salts/polyvinylidene fluoride (PVDF), lithium salts/PEO/PVDF | $LiNi_xCo_yAl_{(1-x-y)}O_2$ (NCA) | aluminum (Al) | copper (Cu) |
| copper (Cu) foil | lithium metal (Li) | lithium salts/polyethylene oxide (PEO), lithium salts/polyvinylidene fluoride (PVDF), lithium salts/PEO/PVDF | $LiNi_xMn_yCo_{(1-x-y)}O_2$ (NCM) | aluminum (Al) | copper (Cu) |

It is further understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An apparatus for deposition of electrochemical cells for battery devices, the apparatus comprising:

a single deposition chamber comprising a first material source configured to deposit a first material, the first material source being configured to deposit an anode material or a cathode material, the first material source being at least one of a metal oxide source, a metal phosphate source, a lithium metal source, or a lithium metal alloy source, and with a second material source configured to deposit a second material, the second material source being configured to deposit an electrolyte, the second material source being a lithium phosphorous compound source or a polymeric material source;

a first gate comprising a first evacuation chamber in fluid communication with the single deposition chamber and configured to be maintained under gas and pressure conditions similar to conditions within the single deposition chamber;

a second gate comprising a second evacuation chamber in fluid communication with the single deposition chamber and configured to be maintained under gas and pressure conditions similar to the conditions within the single deposition chamber;

a substrate positioned between two reels and extending through the first gate, the single deposition chamber, and the second gate; and a controller, in electronic communication with a non-transitory computer readable medium, programmed to move the substrate in alternating directions through the single deposition chamber and to instruct the single deposition chamber to deposit on the substrate an electrode from the first material derived from the first material source when the substrate is moved in a first direction, and then to deposit on the electrode an electrolyte from the second material derived from the second material source when the substrate is moved in a second direction to form a single, discrete electrochemical cell; the controller is programmed to continue to move the substrate in alternating directions and to instruct the single deposition chamber to form other electrochemical cells overlying the single, discrete electrochemical cell to form a stacked configuration comprising the single, discrete electrochemical cell and the other, overlying electrochemical cells, wherein the controller is programmed to form at least two other electrochemical cells in addition to the single, discrete electrochemical cell, each discrete electrochemical cell being spaced apart from the other discrete electrochemical cells along a length of the substrate, and wherein the controller is programmed to increase the spacing between each successive pair of electrochemical cells along the length of the substrate.

2. The apparatus of claim 1 wherein the chamber is configured to perform deposition utilizing one or a combination of methods selected from the group consisting of evaporation, physical vapor deposition (PVD), chemical vapor deposition, sputtering, radio frequency magnetron sputtering, microwave plasma enhanced chemical vapor deposition (MPECVD), pulsed laser deposition (PLD), laser ablation, spray deposition, spray pyrolysis, spray coating, or plasma spraying.

3. The apparatus of claim 1 wherein the chamber is configured to deposit nanowire structures, nanotube structures, or nanobelt structures, or a combination of those structures.

4. The apparatus of claim 1 wherein the chamber is configured to deposit Group III-IV semiconductor nanowires, zinc (Zn) or zinc oxide (ZnO) nanowires, nanobelts of semiconducting oxides of zinc, tin, indium, cadmium, and gallium, carbon nanotubes, or carbon meso-structures.

5. The apparatus of claim 1 further comprising a vacuum source in fluid communication with the deposition chamber.

6. The apparatus of claim 1 further comprising a radiation source in communication with the deposition chamber.

7. The apparatus of claim 1 further comprising a thermal source in communication with the deposition chamber.

8. The apparatus of claim 1 further comprising an optical source in communication with the deposition chamber.

9. A system for reel-to-reel apparatus for continuous manufacture of discrete electrochemical cells in a stacked structure for batteries, the system comprising an apparatus comprising:

a single deposition chamber comprising a first material source configured to deposit a first material, the first material source configured to deposit an anode material or a cathode material, the first material source being at least one of a metal oxide source, a metal phosphate source, a lithium metal source, or a lithium metal alloy source, and with a second material source configured to deposit a second material, the second material source being configured to deposit an electrolyte, the second material source being either a lithium phosphorous compound source, or a polymeric material source;

a first gate comprising a first evacuation chamber in fluid communication with the single deposition chamber and configured to be maintained under a determined pressure similar to a pressure within the single deposition chamber;

a second gate comprising a second evacuation chamber in fluid communication with the deposition chamber and configured to be maintained under the determined pressure similar to the pressure within the single deposition chamber;

a substrate for a battery device positioned between a first reel and a second reel, configured to be movable from the first gate, through the single deposition chamber, and the second gate, and extending from the first gate, the single deposition chamber, and the second gate; and a controller, in electronic communication with a non-transitory computer readable medium, programmed to rotate the first reel and the second reel in alternating directions through the single deposition chamber and to provide an instruction to deposit on the substrate an electrode material from the first material derived from the first material source when the substrate is moved in a first direction, and then to deposit on the electrode material an electrolyte material from the second material derived from the second material source when the substrate is moved in a second direction opposite to the first direction and thereafter to deposit on the electrolyte from a third material another electrode to form a single, discrete electrochemical cell; and the controller is programmed to rotate the reels in alternating directions and to instruct the single deposition chamber to deposit on the single, discrete electrochemical cell other materials for manufacture of a plurality of other electrochemical cells overlying the single, discrete electrochemical cell;

wherein the deposition of the first material is during a first time period, and the deposition of the second material source is during a second time period subsequent to the first time period, wherein the controller is programmed to form at least two other discrete electrochemical cells in addition to the single, discrete electrochemical cell, each discrete chemical cell being spaced apart from the other discrete electrochemical cells along a length of the substrate, wherein the controller is programmed to rotate the first reel and the second reel in alternating directions for a continuous build-up of a plurality of materials, including the first material, the second material, and the third material, for a manufacture of the plurality of electrochemical cells in the stacked configuration, and wherein the controller is programmed to rotate the first reel and the second reel in alternating directions to increase the spacing between each successive pair of electrochemical cells along the length of the substrate to form a coiled battery comprising the plurality of electrochemical cells in the stacked configuration.

10. The apparatus of claim 9 wherein the chamber is configured to perform deposition utilizing at least one or a combination of methods selected from evaporation, physical vapor deposition (PVD), chemical vapor deposition, sputtering, radio frequency magnetron sputtering, microwave plasma enhanced chemical vapor deposition (MPECVD), pulsed laser deposition (PLD), laser ablation, spray deposition, spray pyrolysis, spray coating, or plasma spraying.

11. The apparatus of claim 9 wherein the chamber is configured to deposit nanowire structures, nanotube structures, nanobelt structures, or a combination of those structures.

12. The apparatus of claim 9 wherein the chamber is configured to deposit at least one material selected from Group III-IV semiconductor nanowires, zinc (Zn) or zinc oxide (ZnO) nanowires, a semiconducting oxide of zinc, a semiconducting oxide of tin, a semiconducting oxide of indium, a semiconducting oxide of cadmium, a semiconducting oxide of gallium, carbon nanotubes, or carbon meso-structures.

13. The apparatus of claim 9 further comprising a vacuum source in fluid communication with the deposition chamber.

14. The apparatus of claim 9 further comprising a radiation source in communication with the deposition chamber.

15. The apparatus of claim 9 further comprising a thermal source in communication with the deposition chamber.

16. The apparatus of claim 9 further comprising an optical source in communication with the deposition chamber.

17. An apparatus for deposition of electrochemical cells, the apparatus comprising:
 a deposition chamber comprising a first material source configured to deposit a first material, the first material source configured to deposit an anode material or a cathode material, the first material source comprising at least one of a metal oxide source, a metal phosphate source, a lithium metal source, or a lithium metal alloy source, and with a second material source configured to deposit a second material, the second material source being configured to deposit an electrolyte, the second material source comprising a lithium phosphorous compound source or a polymeric material source;
 a first gate comprising a first evacuation chamber in fluid communication with the deposition chamber and configured to be maintained under gas and pressure conditions similar to conditions within the deposition chamber;
 a second gate comprising a second evacuation chamber in fluid communication with the deposition chamber and configured to be maintained under gas and pressure conditions similar to conditions within the deposition chamber;
 a substrate positioned between two reels and extending through the first gate, the deposition chamber, and the second gate; and
 a controller, in electronic communication with a non-transitory computer readable medium, programmed to rotate the reels in alternating directions through the deposition chamber and to instruct the deposition chamber to deposit on the substrate an electrode from the first material derived from the first material source when the substrate is moved in a first direction, and then to deposit on the electrode an electrolyte from the second material derived from the second material source when the substrate is moved in a second direction opposite to the first direction and thereafter to deposit on the electrolyte from a third material another electrode to form a single, discrete electrochemical cell; and the controller is programmed to continue to rotate the reels in alternating directions and to instruct the deposition chamber to deposit on the single, discrete, electrochemical cell other materials to form a stacked configuration comprising the single, discrete electrochemical cell and other, overlying electrochemical cells,
 wherein the controller is programmed to form at least two other discrete electrochemical cells in addition to the single, discrete electrochemical cell, each discrete electrochemical cell being spaced apart from the other electrochemical cells along a length of the substrate,
 wherein the controller is programmed to rotate the first reel and the second reel in alternating directions to increase spacing between each successive pair of discrete electrochemical cells along the length of the substrate to form a coiled battery comprising the plurality of electrochemical cells in the stacked configuration, and
 wherein the first material source configured to deposit the first material is configured to deposit an anode or a cathode, and the second material source configured to deposit the second material is configured to deposit an electrolyte.

* * * * *